US012625569B2

(12) United States Patent
Jung et al.

(10) Patent No.: US 12,625,569 B2
(45) Date of Patent: May 12, 2026

(54) ELECTRONIC DEVICE HOUSING AND ELECTRONIC DEVICE INCLUDING THE SAME

(71) Applicant: SAMSUNG ELECTRONICS CO., LTD., Suwon-si (KR)

(72) Inventors: Hyunjung Jung, Suwon-si (KR); Hangyu Hwang, Suwon-si (KR); Hyeonseok Yoon, Suwon-si (KR); Hyoin Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 638 days.

(21) Appl. No.: 17/972,321

(22) Filed: Oct. 24, 2022

(65) Prior Publication Data

US 2023/0120057 A1     Apr. 20, 2023

Related U.S. Application Data

(63) Continuation of application No. PCT/KR2022/012218, filed on Aug. 17, 2022.

(30) Foreign Application Priority Data

Oct. 14, 2021     (KR) ........................ 10-2021-0136545

(51) Int. Cl.
*G06F 3/0354* (2013.01)
*H05K 5/02* (2006.01)

(52) U.S. Cl.
CPC ........... *G06F 3/03545* (2013.01); *H05K 5/02* (2013.01)

(58) Field of Classification Search
CPC .. G06F 3/03545; G06F 1/1626; G06F 1/1637;
G06F 1/1658; G06F 1/1633; G06F
3/0354; H05K 5/02; B32B 3/26; B32B
5/16; B32B 7/02; B32B 9/045; B32B
27/08; B32B 27/14; B32B 27/20; B32B
27/308; B32B 27/34; B32B 27/36; B32B
27/365; B32B 27/38; B32B 27/40; B32B
2264/1051; B32B 2264/1052; B32B
2264/1055; B32B 2264/1057; B32B
2307/402; B32B 2307/7376; B32B
2439/40; C08J 7/04; C08J 7/043;
(Continued)

(56) References Cited

U.S. PATENT DOCUMENTS 9,409,433 B2     8/2016   Carreras

FOREIGN PATENT DOCUMENTS

CN          112702458 A     4/2021
JP          2000-177228 A     6/2000
(Continued)

OTHER PUBLICATIONS

English machine translation for KR20130096922 (Year: 2013).*
(Continued)

*Primary Examiner* — Michael C Miggins
(74) *Attorney, Agent, or Firm* — Sughrue Mion, PLLC

(57)          ABSTRACT

An electronic device housing includes an instrument, a first primer layer provided to cover the instrument, a film layer provided on the first primer layer, a second primer layer provided on the film layer, and a coating layer provided on the second primer layer. The film layer includes at least one overwrap at which the film layer overlaps that is configured to surround the first primer layer.

17 Claims, 11 Drawing Sheets

(58) Field of Classification Search
CPC ... C08J 7/042; C08K 3/08; C09D 5/00; C09D 7/61; C09D 133/00; C09D 163/00; C09D 167/00; C09D 175/04; C09D 5/002; B05D 7/54; B05D 7/58; B05D 2201/04; B05D 2201/06; H04M 1/0283
See application file for complete search history.

(56) References Cited

FOREIGN PATENT DOCUMENTS

| JP | 200767154 A | 3/2007 |
|----|----|----|
| KR | 10-0470744 B1 | 3/2005 |
| KR | 10-0529286 B1 | 11/2005 |
| KR | 10-0685292 B1 | 2/2007 |
| KR | 100987346 B1 | 10/2010 |
| KR | 1020130008795 A | 1/2013 |
| KR | 1020130096922 A | 9/2013 |
| KR | 102055330 B1 | 1/2020 |

OTHER PUBLICATIONS

English machine translation for JP2007-067154 (Year: 2007).*
Communication issued May 6, 2025 by the European Patent Office in European Patent Application No. 22881185.7.
Communication dated Aug. 21, 2025 issued by the Korean Intellectual Property Office in Korean Patent Application No. 10-2021-0136545.
Communication issued on Oct. 8, 2024 by the European Patent Office for European Patent Application No. 22881185.7.
International Search Report (PCT/ISA/210), issuance Nov. 15, 2022, issued by the International Searching Authority in International Application No. PCT/KR2022/012218.

* cited by examiner

ELECTRONIC DEVICE HOUSING AND ELECTRONIC DEVICE INCLUDING THE SAME

CROSS-REFERENCE TO RELATED APPLICATIONS

This application is a bypass continuation application of International Application No. PCT/KR2022/012218 designating the United States, filed on Aug. 17, 2022, in the Korean Intellectual Property Receiving Office and claiming priority to Korean Patent Application No. 10-2021-0136545 filed on Oct. 14, 2021, in the Korean Intellectual Property Office, the disclosures of which are incorporated by reference herein in their entireties.

BACKGROUND

1. Field

The disclosure relates generally to an electronic device housing and an electronic device including the electronic device housing.

2. Description of the Related Art

There are various types of electronic devices. For example, an electronic device may receive an input from a user through a touchscreen, providing the user with an additional input means, for example, a pen, to allow the user to make a more precise touch input or hovering input. The user may input information to the touchscreen of the electronic device using the pen. Such a pen-type electronic device may include a coil inside thereof by which the information is input to the screen through coil-based electromagnetic induction.

The electronic device of this type may include a housing and a support member formed of various materials, which may protect components provided inside the electronic device from an external impact. The housing and the support member may also be portable and be manufactured to be viewed as more favorable and stylish on the outside by users.

In general, metal deposition may be used to implement a metallic texture on a surface of an instrument used as a housing of an electronic device (hereinafter also referred to as an electronic device housing). To deposit metal, metal deposition may be performed by seating the instrument on a jig in a deposition machine and then depositing metal particles thereon. In this case, a deviation in the deposition of the metal particles may occur depending on a direction of the instrument seated on the jig and a position of the jig.

To protect a thin deposited layer and secure durability, post-processing may be performed, through which a primer layer may be formed to strengthen a chemical bond specific to a painted layer including organic matters. In this case, a primer may be additionally applied and the entire coating layer may thus become thicker.

In addition, the amount of paint to be sprayed may increase, and a portion of the paint may flow down by gravity to be lumpy, which may result in poor appearance.

SUMMARY

One or more example embodiments may address at least the above problems and/or disadvantages and other disadvantages not described above. Also, the example embodiments are not required to overcome the disadvantages described above, and an example embodiment may not overcome any of the problems described above.

Provided are systems, methods and devices where the exterior of the instrument may be formed using metallic paint, and may thus have a relatively lower level of luminance than the actual metal deposited layer.

Additional aspects will be set forth in part in the description which follows and, in part, will be apparent from the description, or may be learned by practice of the presented embodiments.

According to an aspect of the disclosure, an electronic device housing may include an instrument, a first primer layer provided to cover the instrument, a film layer provided on the first primer layer, a second primer layer provided on the film layer, and a coating layer provided on the second primer layer. The film layer may include at least one overwrap at which the film layer overlaps that is configured to surround the first primer layer.

The instrument may include a hollow structure, and the first primer layer may be provided on an outer surface of the instrument.

The instrument may include at least one of polyamide, polyacetal, polycarbonate, polyethylene terephthalate, or polyphenylene oxide.

The first primer layer may include at least one of an acrylic resin, an epoxy resin, or a polyester resin.

The first primer layer may have a thickness of about 1 μm or greater.

The film layer may include at least one metal among aluminum, magnesium, gold, silver, tin, indium, chromium, and copper.

The film layer may have a thickness of about 1 μm to about 5 μm.

The film layer may be formed as a film including metal particles surrounds the first primer layer and heat is applied thereto.

The width of the at least one overwrap may be less than or equal to about 1 mm.

The film layer may include a first layer, a second layer, and a third layer, the first layer may be provided on the first primer layer, the second layer may be provided on the first layer, the third layer may be provided on the second layer such that the third layer is disposed between the second layer and the second primer layer, the first layer may include at least one of an acrylic resin, an epoxy resin, or a polyester resin, the second layer may include metal particles, the third layer may include at least one of an acrylic resin, a polyester resin, an acrylate resin, a modified urethane acrylate resin, or an amine acrylic resin, and a sum of thicknesses of the first layer, the second layer, and the third layer may be about 1 μm to about 5 μm.

The second primer layer may include at least one of an acrylic resin, a polyester resin, an acrylate resin, a modified urethane acrylate resin, or an amine acrylic resin.

The second primer layer may be a thickness of about 3 μm or greater.

The second primer layer may be thicker than the first primer layer.

The second primer layer may include a first resin and a second resin, the first may include a glass transition temperature of about 0° C. to about 30° C., and the second resin may include a glass transition temperature of about 80° C. to about 100° C.

The coating layer may include at least one of a urethane resin, a thermosetting resin, or an ultraviolet (UV) curable resin, and the coating layer may include a thickness of about 15 μm to about 40 μm.

A color layer may be provided between the second primer layer and the coating layer, the color layer may include at least one of $SiO_2$, $TiO_2$, $Al_2O_3$, $Nb_2O_5$, $MgF_2$, $Ti_2O_5$, $SnO_2$, ZnO, $Ta_2O_5$, MgO, $Si_3N_4$, ITO, AlN, AlON, TiN, $Ti_3O_5$, or $ZrO_2$, and the color layer may include a thickness of about 3 μm to about 10 μm.

According to an aspect of the disclosure, a method of manufacturing an electronic device housing may include preparing an instrument, forming a first primer layer by applying a first primer on the instrument, forming a film layer on the first primer layer, forming a second primer layer by applying a second primer on the film layer, and forming a coating layer on the second primer layer. The forming of the film layer may include surrounding the first primer layer with a film comprising metal particles and applying heat thereto.

The film layer may include at least one overwrap at which the film layer overlaps.

The at least one overwrap may include a thickness of about 1 mm or less.

According to an aspect of the disclosure, an electronic device may be surrounded by an electronic device housing, and the electronic device housing may include an instrument, a first primer layer provided to surround the instrument, a film layer provided on the first primer layer, a second primer layer provided on the film layer, and a coating layer provided on the second primer layer. The film layer may include at least one overwrap at which the film layer overlaps that is configured to surround the first primer layer.

According to various example embodiments described herein, an electronic device housing may provide a metallic texture of high luminance to the exterior of an instrument, and secure durability to protect an electronic device inside thereof.

According to various example embodiments described herein, an electronic device housing may be distinguishable in terms of beauty and design on the outside, to which a processing method of transferring and printing a film may be applied to implement a highly luminant metallic texture.

According to various example embodiments described herein, an electronic device housing may be formed thinly in thickness and exhibit a highly luminant metallic texture.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
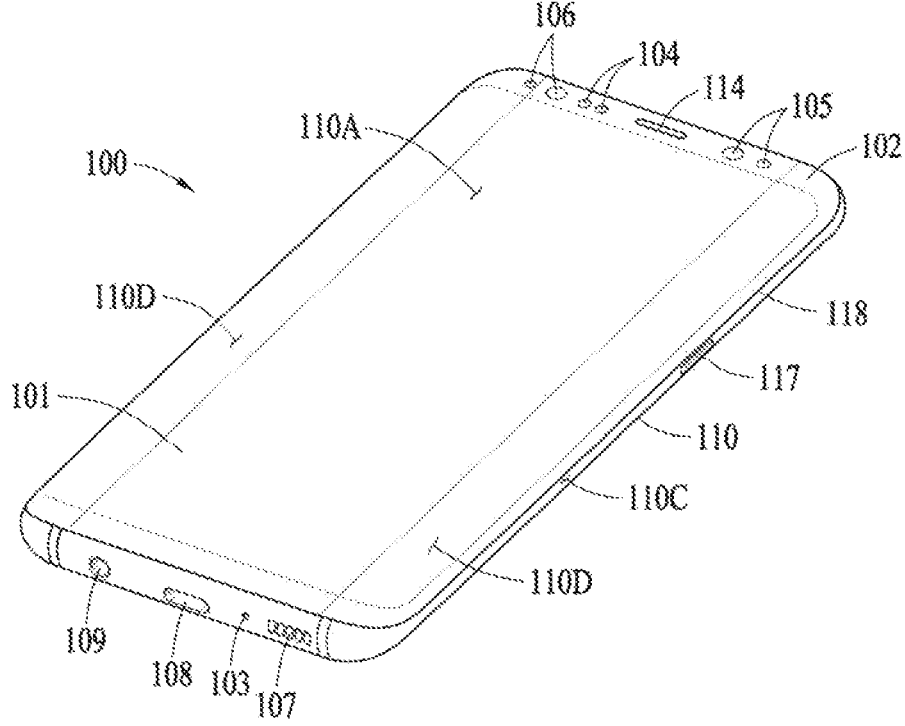
FIG. 1 is a diagram of a mobile electronic device according to various example embodiments.

Hereinafter, various example embodiments will be described in greater detail with reference to the accompanying drawings. When describing the example embodiments with reference to the accompanying drawings, like reference numerals refer to like elements and a repeated description related thereto will be omitted.

FIG. 1 is a diagram of a mobile electronic device according to various example embodiments.

Figure 2:
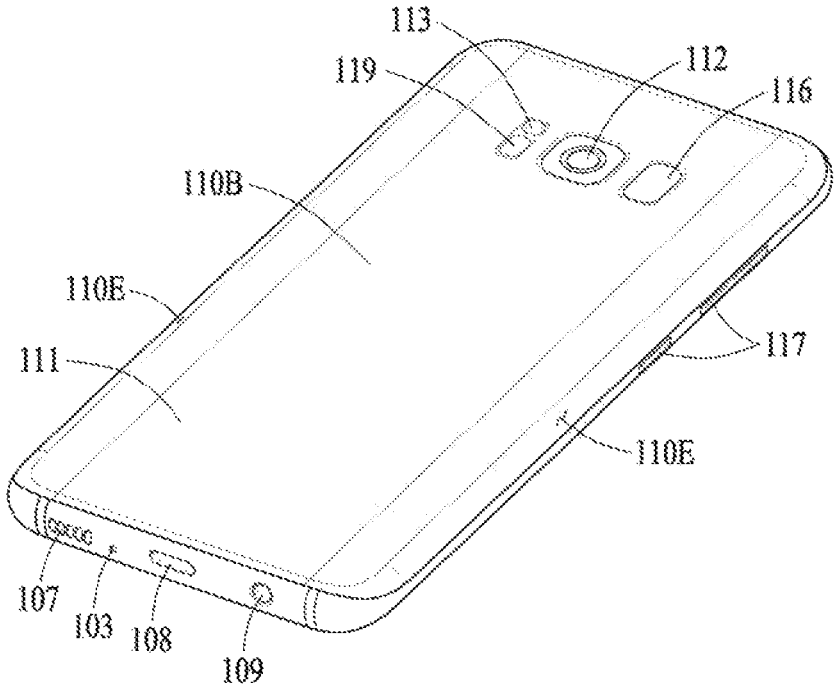
FIG. 2 is a diagram of the electronic device of FIG. 1 according to various example embodiments.

FIG. 2 is a diagram of the electronic device of FIG. 1 according to various example embodiments.

Referring to FIGS. 1 and 2, according to an example embodiment, an electronic device 100 may include a housing 110 including a first surface (or a front surface) 110A, a second surface (or a rear surface) 110B, and a side surface 110C surrounding a space between the first surface 110A and the second surface 110B. According to another example embodiment, the housing 110 may also refer to a structure which forms a portion of the first surface 110A, the second surface 110B, and the side surface 110C of FIG. 1. The first surface 110A may be formed by a front plate 102 (e.g., a glass plate or a polymer plate including various coating layers) of which at least a portion is substantially transparent. The second surface 110B may be formed by a rear plate 111 that is substantially opaque. For example, the rear plate 111 may be formed of coated or colored glass, ceramic, polymer, a metal material (e.g. aluminum, stainless steel (STS), or magnesium), or a combination of at least two of the foregoing. The side surface 110C may be coupled to the front plate 102 and the rear plate 111 and may be formed by a side bezel structure (or a "side member") 118 including a metal and/or polymer. In another example embodiment, the rear plate 111 and the side bezel structure 118 may be integrally formed and may include the same material (e.g., a metal material such as aluminum).

As illustrated, the front plate 102 may include two first areas 110D that are curved and extended seamlessly from the first surface 110A toward the rear plate 111 at both ends of a long edge of the front plate 102. As illustrated in FIG. 2, the rear plate 111 may include two second areas 110E that are curved and extended seamlessly from the second surface 110B toward the front plate 102 at both ends of a long edge thereof. In another example embodiment, the front plate 102 (or the rear plate 111) may include only one of the first areas 110D (or the second areas 110E). In another example embodiment, some of the first areas 110D or the second area 110E may not be included. In the foregoing example embodiments, when viewed from a side of the electronic device 100, the side bezel structure 118 may have a first thickness (or width) at a side without the first areas 110D or the second areas 110E, and may have a second thickness less than the first thickness at a side including the first areas 110D or the second areas 110E.

According to an example embodiment, the electronic device 100 may include at least one of a display 101, audio modules 103, 107, and 114, sensor modules 104, 116, and 119, camera modules 105, 112, and 113, key input devices 117, a light-emitting element 106, or connector holes 108 and 109. In another example embodiment, the electronic device 100 may not include at least one (e.g., the key input devices 117 or the light-emitting element 106) of the components or may additionally include other components.

The display 101 may be visually exposed through a considerable portion of the front plate 102, for example. In another example embodiment, at least a portion of the display 101 may be visually exposed through the first surface 110A and the front plate 102 that forms the first areas 110D of the side surface 110C. In another example embodiment, a corner of the display 101 may be formed to be mostly identical to a shape of an outer portion of the front plate 102 adjacent thereto. In another example embodiment, to increase the size of a visually exposed area of the display 101, a distance between an outer portion of the display 101 and an outer portion of the front plate 102 may be formed mostly identically.

In another example embodiment, the display 101 may have a recess or an opening formed in a portion of a screen display area of the display 101, and may include at least one of the audio module 114, the sensor module 104, the camera module 105, or the light-emitting element 106 that is aligned with the recess or the opening. In another example embodiment, a rear surface of the screen display area of the display 101 may include at least one of the audio module 114, the sensor module 104, the camera module 105, the sensor module 116 (e.g., a fingerprint sensor), or the light-emitting element 106. In another example embodiment, the display 101 may be coupled to or disposed adjacent to a touch sensing circuit, a pressure sensor configured to measure an intensity (pressure) of a touch, and/or a digitizer configured to detect a magnetic-type stylus pen. In some example embodiments, at least a portion of the sensor modules 104 and 119, and/or at least a portion of the key input devices 117 may be disposed in the first areas 110D and/or the second areas 110E.

The audio modules 103, 107, and 114 may include a microphone hole (e.g., the audio module 103) and speaker holes (e.g., the audio modules 107 and 114). A microphone for acquiring an external sound may be disposed inside the microphone hole (e.g., the audio module 103). In another example embodiment, a plurality of microphones may be disposed to detect a direction of a sound. The speaker holes (e.g., the audio modules 107 and 114) may include an external speaker hole (e.g., the audio module 107) and a receiver hole (e.g., the audio module 114) for a call. In another example embodiment, the speaker holes (e.g., the audio modules 107 and 114) and the microphone hole (e.g., the audio module 103) may be implemented as a single hole, or a speaker (e.g., a piezo speaker) may be included without the speaker holes (e.g., the audio modules 107 and 114).

The sensor modules 104, 116, and 119 may generate an electrical signal or a data value corresponding to an internal operating state of the electronic device 100 or an external environmental state. The sensor modules 104, 116, and 119 may include, for example, a first sensor module 104 (e.g., a proximity sensor) and/or a second sensor module (e.g., a fingerprint sensor) disposed on the first surface 110A of the housing 110, and/or a third sensor module 119 (e.g., a heart rate monitoring (HRM) sensor) and/or a fourth sensor module 116 (e.g., a fingerprint sensor) disposed on the second surface 110B of the housing 110. The fingerprint sensor may be disposed on both the first surface 110A (e.g., the display 101) and the second surface 110B of the housing 110. The electronic device 100 may further include at least one of sensor modules, for example, a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, and an illuminance sensor 104.

The camera modules 105, 112, and 113 may include a first camera device 105 disposed on the first surface 110A of the electronic device 100, and a second camera device 112 and/or a flash 113 disposed on the second surface 110B. The camera modules 105 and 112 may each include one or more lenses, an image sensor, and/or an image signal processor. The flash 113 may include, for example, a light-emitting diode (LED) or a xenon lamp. In another example embodiment, two or more lenses (e.g., IR camera, wide-angle, and telephoto lenses) and image sensors may be disposed on one surface of the electronic device 100.

The key input devices 117 may be disposed on the side surface 110C of the housing 110. In another example embodiment, the electronic device 100 may not include some or all of the key input devices 117, and some of the key input devices 117 that is not included may be implemented in another form such as a soft key on the display 101. In another example embodiment, the key input devices 117 may include the sensor module 116 disposed on the second surface 110B of the housing 110.

The light-emitting element 106 may be disposed on the first surface 110A of the housing 110, for example. The light-emitting element 106 may provide state information of the electronic device 100 in the form of light, for example. In another example embodiment, the light-emitting element 106 may provide a light source linked to an operation of the camera module 105, for example. The light-emitting element 106 may include, for example, an LED, an IR LED, and a xenon lamp.

The connector holes 108 and 109 may include a first connector hole 108 for accommodating a connector (e.g., a universal serial bus (USB) connector) for transmitting and receiving power and/or data to and from an external electronic device, and/or a second connector hole 109 (e.g., an earphone jack) for accommodating a connector for transmitting and receiving an audio signal to and from an external electronic device.

Figure 3:
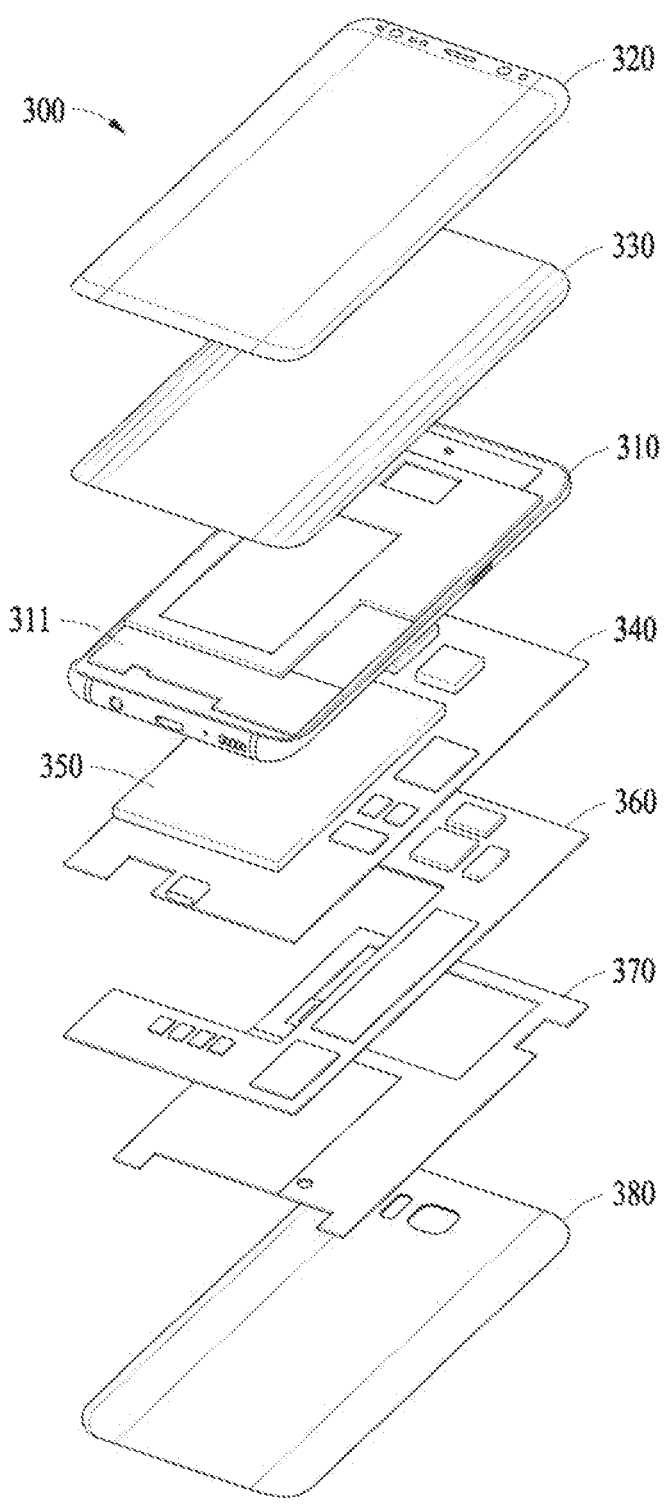
FIG. 3 is a diagram of the electronic device of FIG. 1 according to various example embodiments.

FIG. 3 is a diagram of the electronic device of FIG. 1 according to various example embodiments. Referring to FIG. 3, an electronic device 300 may include a side bezel structure 310, a first support member 311 (e.g., a bracket), a front plate 320, a display 330, a printed circuit board (PCB) 340, a battery 350, a second support member 360 (e.g., a rear case), an antenna 370, and a rear plate 380. In some example embodiments, the electronic device 300 may not include at least one (e.g., the first support member 311 or the second support member 360) of the components or may additionally include other components. At least one of the components of the electronic device 300 may be the same as or similar to at least corresponding one of the components of the electronic device 100 of FIG. 1 or 2, and a repeated description thereof will be omitted hereinafter.

The first support member 311 may be disposed inside the electronic device 300 and connected to the side bezel structure 310, or may be formed integrally with the side bezel structure 310. The first support member 311 may be formed of a metal material and/or a non-metal material (e.g., a polymer), for example. The first support member 311 may have one surface to which the display 330 is coupled and another surface to which the PCB 340 is coupled. On the PCB 340, a processor, a memory, and/or an interface may be provided. The processor may include, for example, one or more of a central processing unit (CPU), an application processor, a graphics processing unit (GPU), an image signal processor, a sensor hub processor, and a communication processor.

The memory may include, for example, a volatile memory or a non-volatile memory.

The interface may include, for example, a high-definition multimedia interface (HDMI), a USB interface, a secure digital (SD) card interface, or an audio interface. For example, the interface may electrically or physically connect the electronic device 300 to an external electronic device, and may include a USB connector, an SD card/multimedia card (MMC) connector, or an audio connector.

The battery 350, a device for supplying power to at least one component of the electronic device 300, may include, for example, a primary cell that is not rechargeable, a secondary cell that is rechargeable, or a fuel cell. For example, at least a portion of the battery 350 may be disposed on substantially the same plane as the PCB 340. The battery 350 may be disposed integrally inside the electronic device 300 or disposed detachably from the electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. For example, the antenna 370 may perform short-range communication with an external device, or may wirelessly transmit and receive power required for charging to and from the external device. In another example embodiment, an antenna structure may be formed by a portion of the side bezel structure 310 and/or the first support member 311 or a combination thereof.

Figure 4:
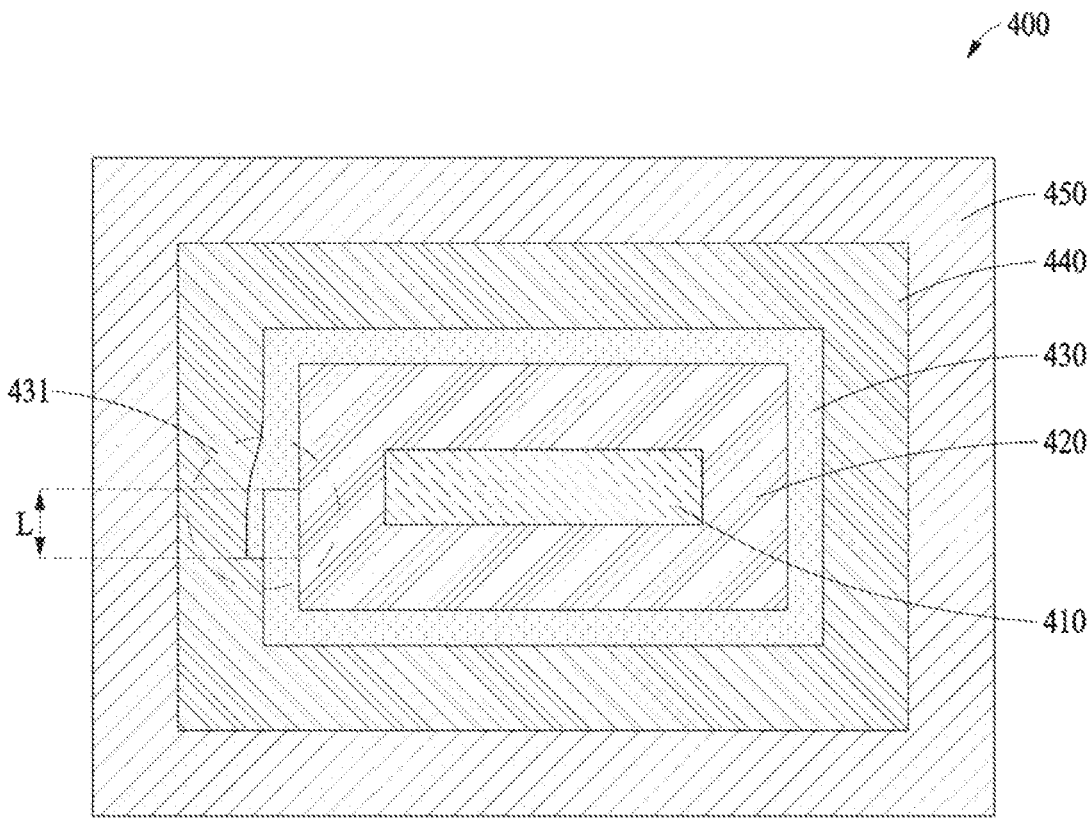
FIG. 4 is a diagram of an electronic device housing according to various example embodiments.

FIG. 4 is a diagram of an electronic device housing according to various example embodiments.

According to an example embodiment, an electronic device housing 400 may include an instrument 410, a first primer layer 420 formed on the instrument 410, a film layer 430 formed on the first primer layer 420, a second primer layer 440 formed on the film layer 430, and a coating layer 450 formed on the second primer layer 440.

For example, the instrument 410 may be formed through plastic injection and be an aluminum alloy. However, the instrument 410 is not limited to the foregoing example, but one that is applicable as a housing to protect an electronic device may be used.

The instrument 410 may be a plastic injected part formed through plastic injection and may have a metallic texture by the film layer 430 formed on the instrument 410. The first primer layer 420 may be formed to enhance adhesion between the instrument 410 and the film layer 430.

The instrument 410 may include a polymer, and may include at least one of polyamide, polyacetal, polycarbonate, polyethylene terephthalate, or polyphenylene oxide. The instrument 410 may include engineering plastic.

The first primer layer 420 may be formed to cover the instrument 410, and the film layer 430 may also be formed to surround the first primer layer 420. The first primer layer 420 may be formed to secure adhesion between the instrument 410 and the film layer 430.

The first primer layer 420 may include at least one of an acrylic resin, an epoxy resin, or a polyester resin. The first primer layer 420 may include an acrylic resin, for example.

The first primer layer 420 may have a thickness of approximately 1 micrometer (m) or greater. The thickness of the first primer layer 420 may be approximately 1 μm or greater, approximately 2 μm or greater, approximately 3 μm or greater, or approximately 4 μm or greater, and approximately 5 μm or less, approximately 4 μm or less, approximately 3 μm or less, or approximately 2 μm or less, or may be included in a range between two selected from the numerical values described in the foregoing. For example, the thickness of the first primer layer 420 may be approximately 1 μm to 5 μm.

The film layer 430 may be formed on the first primer layer 420, and more particularly, be formed to surround the first primer layer 420. The film layer 430 may be formed by rolling a sheet-type film around the instrument 410 on which the first primer layer 420 is formed, and may be formed to surround the first primer layer 420. The film layer 430 may be formed to surround the first primer layer 420 partially or entirely, and may thereby have an overwrap 431 in a portion thereof at which the sheet-type film overlaps by two or more sheets.

The film layer 430 may be formed using one or more, or two or more films by rolling the one or more or two or more films around a portion or an entirety of a surface of the first primer layer 420, and the overwrap 431 may thereby be formed as ends of the one or more or two or more films overlap. For example, when the films do not form such an overwrap, a portion of the first primer layer 420 may be externally exposed, and a parting line that is formed by an end boundary of the films may be outstanding to degrade an esthetic impression of the exterior.

The film layer 430 may be formed by transferring and printing one or more or two or more films. The film layer 430 may be formed as the one or more or two or more films surround the first primer layer 420 and heat is applied thereto. The film layer 430 may be formed by moving a film heated by applying heat thereto while rotating the instrument 410 on which the first primer layer 420 is formed and allowing the film to surround the surface of the first primer layer 420 partially or entirely.

The film layer 430 may include at least one metal among aluminum, magnesium, gold, silver, tin, indium, chromium, and copper. The film layer 430 may include, in the form of metal particles, the at least one metal among aluminum, magnesium, gold, silver, tin, indium, chromium, and copper. The film layer 430 may include metal and may thus implement a highly luminant metallic texture.

The film layer 430 may have a thickness of approximately 1 to 5 μm. The thickness of film layer 430 may be approximately 1 μm or greater, approximately 2 μm or greater, approximately 3 μm or greater, or approximately 4 μm or greater, and approximately 5 μm or less, approximately 4 μm or less, approximately 3 μm or less, or approximately 2 μm or less. The thickness thereof may be included in a range between two selected from the numerical values described in the foregoing. For example, the thickness of the film layer 430 may be approximately 1 μm to 5 μm.

The film layer 430 may be formed by rolling one or more films to surround the first primer layer 420, and may thus have the overwrap 431 at which ends of the films overlap. The overwrap 431 may be an area of the film layer 430 that is locally formed as multiple layers including two or more layers. A width (or length) L of the overwrap 431 may refer to a length from a point at which the films start overlapping to a point at which the overlapping of the films ends.

The width L of the overwrap 431 may be approximately 1 millimeter (mm) or less. The overwrap 431 may be provided to prevent the generation of a parting line of the film layer 430, and the width L of the overwrap 431 may be approximately 0.5 mm or less, or desirably be approximately 0.4 mm or less, approximately 0.3 mm or less, or approximately 0.2 mm or less.

The film layer 430 may include a plurality of layers. For example, the film layer 430 may include a first layer, a second layer, and a third layer, which may be sequentially laminated.

The first layer may be formed on the first primer layer 420, the second layer may be formed on the first layer, and the third layer may be formed on the second layer. The film layer 430 may include the layers of which the first layer may be formed on a surface in contact with the first primer layer 420 and the third layer may be formed on a surface in contact with the second primer layer 440. Although the film layer 430 including three layers has been described above, it may be obvious to those having skill in the art that the film layer 430 may include two layers or four or more layers.

The first layer may include at least one of an acrylic resin, an epoxy resin, or a polyester resin. For example, the first layer may include an acrylic resin. The second layer may include metal particles. For example, the second layer may include at least one metal particle among aluminum, magnesium, gold, silver, tin, indium, chromium, and copper. The third layer may include at least one of an acrylic resin, a polyester resin, an acrylate resin, a modified urethane acrylate resin, or an amine acrylic resin. For example, the third layer may include at least two of an acrylic resin, a polyester resin, an acrylate resin, a modified urethane acrylate resin, or an amine acrylic resin.

A sum of respective thicknesses of the first layer, the second layer, and the third layer may be approximately 1 μm to 5 μm. The sum of the thicknesses of the first layer, the second layer, and the third layer may be approximately 1 μm or greater, approximately 2 μm or greater, approximately 3 μm or greater, or approximately 4 μm or greater, and approximately 5 μm or less, approximately 4 μm or less, approximately 3 μm or less, or approximately 2 μm or less. The sum may be included in a range between two selected from the numerical values described in the foregoing.

The second primer layer 440 may be formed on the film layer 430, and formed on an entire or partial area of the film layer 430. The second primer layer 440 may be formed on a portion of the film layer 430, and formed on the overwrap 431 of the film layer 430. The second primer layer 440 may be formed to secure adhesion between the film layer 430 and the coating layer 450.

The second primer layer 440 may include at least one of an acrylic resin, a polyester resin, an acrylate resin, a modified urethane acrylate resin, or an amine acrylic resin. The second primer layer 440 may include at least two of an acrylic resin, a polyester resin, an acrylate resin, a modified urethane acrylate resin, or an amine acrylic resin.

The second primer layer 440 may have a thickness of approximately 3 μm or greater. The thickness of the second primer layer 440 may be approximately 3 μm or greater, approximately 4 μm or greater, approximately 5 μm or greater, approximately 6 μm or greater, approximately 7 μm or greater, approximately 8 μm or greater, approximately 9 μm or greater, and approximately 10 μm or less, approximately 9 μm or less, approximately 8 μm or less, approximately 7 μm or less, approximately 6 μm or less, approximately 5 μm or less, or approximately 4 μm or less. The thickness of the second primer layer 440 may be included in a range between two selected from the numerical values described in the foregoing. For example, the thickness of the second primer layer 440 may be approximately 3 μm to 10 μm.

The second primer layer 440 may be thicker than the first primer layer 420. The second primer layer 440 may be formed by mixing two or more resins to protect the film layer 430 and secure adhesion, and the thickness of the second primer layer 440 may be thicker than the first primer layer 420 to provide a cushioning effect.

The second primer layer 440 may include two or more resins having a glass transition temperature of 0° C. to 30° C. and of 80° C. to 100° C., respectively. For example, the second primer layer 440 may include a first resin and a second resin, with the first resin having a glass transition temperature of 0° C. to 30° C. and the second resin having a glass transition temperature of 80° C. to 100° C. For another example, the second primer layer 440 may include a first resin, a second resin, and a third resin, with the first resin having a glass transition temperature of 0° C. to 30° C., the second resin having a glass transition temperature of 80° C. to 100° C., and the third resin having a glass transition temperature of 0° C. to 30° C. or 80° C. to 100° C.

The second primer layer 440 including two or more resins having different glass transition temperatures may be hardened at time intervals and may thereby provide a cushioning effect that protects an upper layer of the film layer 430.

The coating layer 450 may include at least one of a urethane resin, a thermosetting resin, or an ultraviolet (UV) curable resin. The coating layer 450 may have a thickness of 15 μm to 40 μm.

The coating layer 450 may be provided to complement durability of the film layer 430 and protect the exterior of the instrument 410 on which the film layer 430 is formed.

Figure 5:
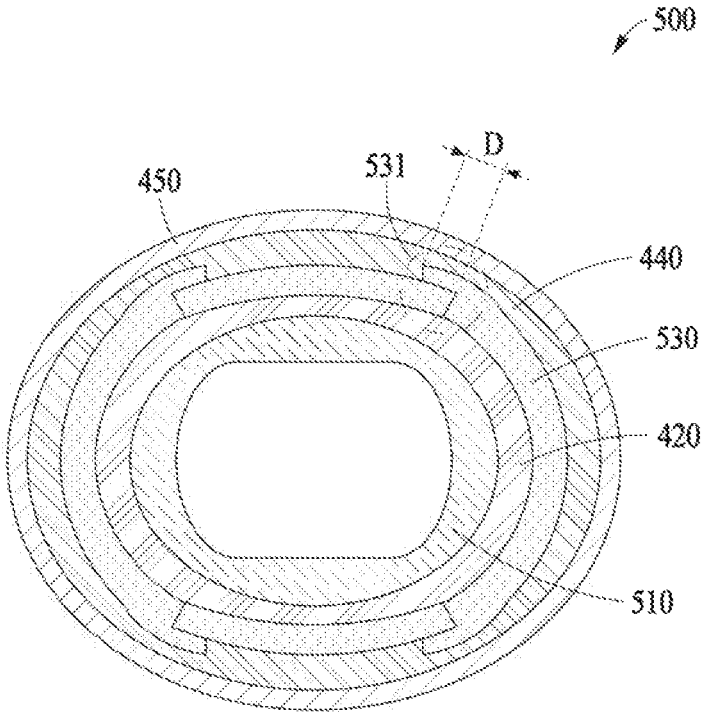
FIG. 5 is a diagram of an electronic device housing according to various example embodiments.

FIG. 5 is a diagram of an electronic device housing according to various example embodiments.

According to an example embodiment, an electronic device housing 500 may include an instrument 510 (e.g., the instrument 410 of FIG. 4), a first primer layer 420 formed on the instrument 510, a film layer 530 (e.g., the film layer 430 of FIG. 4) formed on the first primer layer 420, a second primer layer 440 formed on the film layer 530, and a coating layer 450 formed on the second primer layer 440.

The instrument 510 may include a hollow structure. The instrument 510 may be a hollow structure that is symmetrical with respect to an axis as a center. The instrument 510 may have a hollow cylindrical structure and be provided as a long cylindrical structure in the form of a pen, for example. With the hollow structure being included, the instrument 510 may have an inner surface and an outer surface, and the first primer layer 420 may be formed on the outer surface of the instrument 510.

The film layer 530 may be formed on the first primer layer 420, and be obtained by transferring and printing two or more films. As illustrated in FIG. 5, the film layer 530 may be obtained by transferring and printing four films. The film layer 530 may be formed by first forming the films in one direction and a direction opposite to the direction on a surface of the first primer layer 420, and then by secondly forming the films in a direction vertical to the direction.

Referring to FIG. 5, the film layer 530 may be formed using a plurality of films, and have a plurality of overwraps 531 (e.g., the overwrap 431 of FIG. 4) that is formed as the films overlap. Each of the overwraps 531 may be where the films overlap by a width D, and a width D of an overwrap 531 may be less than or equal to 1 mm. In addition, a width L of the overwrap 531 may be less than or equal to 0.5 mm and desirably be approximately 0.4 mm or less, 0.3 mm or less, or 0.2 mm or less.

Figure 6:
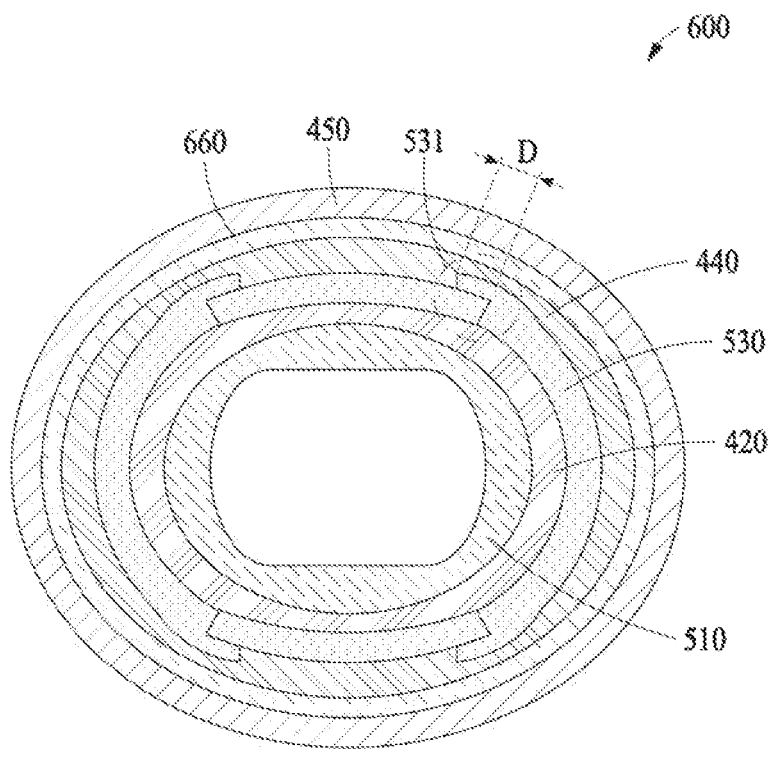
FIG. 6 is a diagram of an electronic device housing according to various example embodiments.

FIG. 6 is a diagram of an electronic device housing according to various example embodiments, According to an example embodiment, an electronic device housing 600 may include an instrument 510 (e.g., the instrument 410 of FIG. 4), a first primer layer 420 formed on the instrument 510, a film layer 530 (e.g., the film layer 430 of FIG. 4) formed on the first primer layer 420, a second primer layer 440 formed on the film layer 530, and a coating layer 450 formed on the second primer layer 440. The electronic device housing 600 may further include a color layer 660 disposed between the second primer layer 440 and the coating layer 450. The color layer 660 may be formed on the primer layer 440 before the coating layer 450 is formed on the second primer layer 440.

The color layer 660 may add a color to the electronic device housing 600. The color layer 660 may include at least one of $SiO_2$, $TiO_2$, $Al_2O_3$, $Nb_2O_5$, $MgF_2$, $Ti_2O_5$, $SnO_2$, ZnO, $Ta_2O_5$, MgO, $Si_3N_4$, ITO, AlN, AlON, TiN, $Ti_3O_5$, or $ZrO_2$.

The color layer 660 may have a thickness of approximately 3 μm to 10 μm. The thickness of the color layer 660 may be approximately 3 μm or greater, approximately 4 μm or greater, approximately 5 μm or greater, approximately 6 μm or greater, approximately 7 μm or greater, approximately 8 μm or greater, or approximately 9 μm or greater, and approximately 10 μm or less, approximately 9 μm or less, approximately 8 μm or less, approximately 7 μm or less, approximately 6 μm or less, approximately 5 μm or less, or approximately 4 μm or less. The thickness of the color layer 660 may be included in a range between two selected from the numerical values described in the foregoing.

According to an example embodiment, an electronic device housing (e.g., the electronic device housing 400 of FIG. 4) may include an instrument (e.g., the instrument 410 of FIG. 4), a first primer layer (e.g., the first primer layer 420 of FIG. 4) formed to cover the instrument, a film layer (e.g., the film layer 430 of FIG. 4) formed on the first primer layer, a second primer layer (e.g., the second primer layer 440 of FIG. 4) formed on the film layer, and a coating layer (e.g., the coating layer 450 of FIG. 4) formed on the second primer layer. The film layer may have at least one overwrap (e.g., the overwrap 431 of FIG. 1) at which the film layer overlaps as the film layer is formed to surround the first primer layer 430.

According to an example embodiment, an instrument (e.g., the instrument 510 of FIG. 1) may include a hollow structure, and a first primer layer (e.g., the first primer layer 420 of FIG. 5) may be formed on an outer surface of the instrument.

The instrument may include at least one of polyamide, polyacetal, polycarbonate, polyethylene terephthalate, or polyphenylene oxide.

The first primer layer may include at least one of an acrylic resin, an epoxy resin, or a polyester resin.

The first primer layer may have a thickness of 1 μm or greater.

According to an example embodiment, a film layer (e.g., the film layer 430 of FIG. 4 and the film layer 530 of FIG. 5) may include at least one metal among aluminum, magnesium, gold, silver, tin, indium, chromium, and copper.

The film layer (e.g., the film layer 430 of FIG. 4) may have a thickness of 1 μm to 5 μm.

The film layer may be formed as a film including metal particles surrounds the first primer layer and heat is applied thereto.

According to an example embodiment, an overwrap (e.g., the overwrap 431 of FIG. 4) may have a width of 1 mm or less.

The film layer may (e.g., the film layer 430 of FIG. 4) include a first layer, a second layer, and a third layer. The first layer may be formed on the first primer layer (e.g., the first primer layer 420 of FIG. 4), the second layer may be formed on the first layer, and the third layer may be formed on the second layer to be disposed between the second layer and a second primer layer (e.g., the second primer layer 440 of FIG. 4). The first layer may include at least one of an acrylic resin, an epoxy resin, or a polyester resin. The second layer may include metal particles. The third layer may include at least one of an acrylic resin, a polyester resin, an acrylate resin, a modified urethane acrylate resin, or an amine acrylic resin. A sum of respective thicknesses of the first layer, the second layer, and the third layer may be 1 μm to 5 μm.

The second primer layer may include at least one of an acrylic resin, a polyester resin, an acrylate resin, a modified urethane acrylate resin, or an amine acrylic resin.

The second primer layer may have a thickness of 3 μm or greater.

The second primer layer may be thicker than the first primer layer.

The second primer layer may include two or more resins having respective glass transition temperatures of 0° C. to 30° C. and 80° C. to 100° C.

According to an example embodiment, a coating layer (e.g., the coating layer 450 of FIG. 4) may include at least one of a urethane resin, a thermosetting resin, or a UV curable resin, and may have a thickness of 15 μm to 40 μm.

According to an example embodiment, the second primer layer (e.g., the second primer layer 440 of FIG. 6) may further include a color layer (e.g., the color layer 660 of FIG. 6) disposed between the second primer layer and the coating layer (e.g., the coating layer 450 of FIG. 6), and the color layer may include at least one of $SiO_2$, $TiO_2$, $Al_2O_3$, $Nb_2O_5$, $MgF_2$, $Ti_2O_5$, $SnO_2$, ZnO, $Ta_2O_5$, MgO, $Si_3N_4$, ITO, AlN, AlON, TiN, $Ti_3O_5$, or $ZrO_2$. The color layer may have a thickness of 3 μm to 10 μm.

Figure 7:
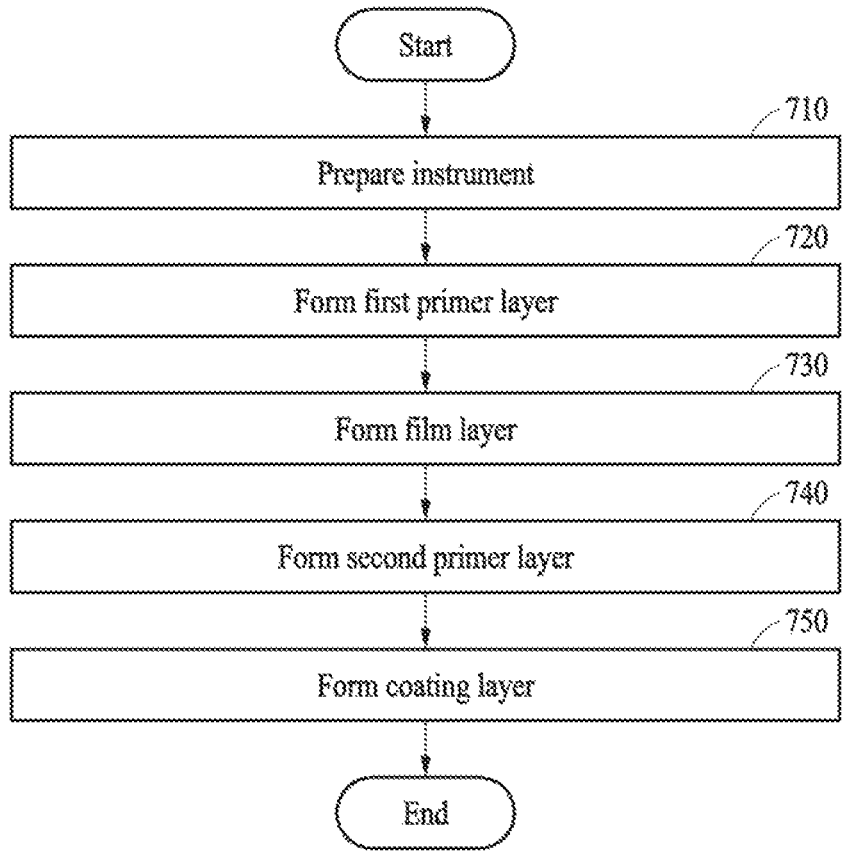
FIG. 7 is a flowchart of a process of manufacturing an electronic device housing according to various example embodiments.

FIG. 7 is a flowchart of a process of manufacturing an electronic device housing according to various example embodiments.

Referring to FIG. 7, a method of manufacturing an electronic device housing may include operation 710 of preparing an instrument, operation 720 of forming a first primer layer by applying a first primer on the instrument, operation 730 of forming a film layer on the first primer layer, operation 740 of forming a second primer layer by applying a second primer on the film layer, and operation 750 of forming a coating layer on the second primer layer.

FIGS. 8A, 8B, 8C, 8D, 8E and 8F are schematic views illustrating a process of manufacturing an electronic device housing according to various example embodiments.

Figure 8:
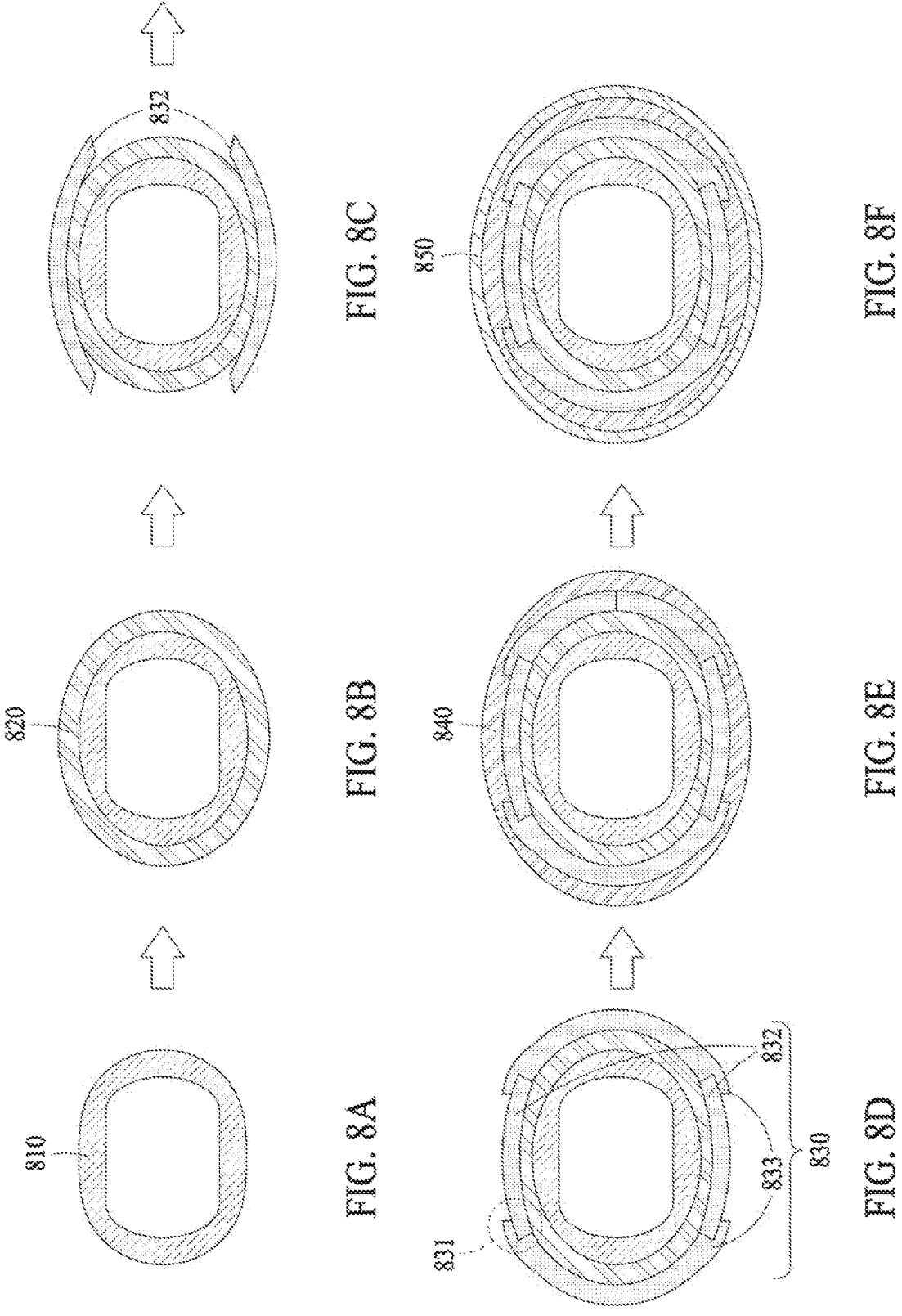
FIGS. 8A, 8B, 8C, 8D, 8E and 8F are schematic views illustrating a process of manufacturing an electronic device housing according to various example embodiments.

The schematic views illustrating a process of manufacturing an electronic device housing of FIGS. 8A through 8F may correspond to a flow of the operations performed to manufacture an electronic device housing described above with reference to FIG. 7. The process of manufacturing an electronic device housing may include an operation (e.g., operation 710 in FIG. 7) of preparing an instrument 810 as illustrated in FIG. 8A, an operation (e.g., operation 720 in FIG. 7) of forming a first primer layer 820 by applying a first primer on the instrument 810 as illustrated in FIG. 8B, an operation (e.g., operation 730 in FIG. 7) of forming a film layer 830 on the first primer layer 820 as illustrated in FIGS. 8C and 8D, an operation (e.g., operation 740 in FIG. 7) of forming a second primer layer 840 by applying a second primer on the film layer 830 as illustrated in FIG. 8E, and an operation (e.g., operation 750 in FIG. 7) of forming a coating layer 850 on the second primer layer 840 as illustrated in FIG. 8F.

The components of the electronic device housing described above with reference to FIGS. 7 and 8A through 8F may correspond to the components of the electronic device housing described above with reference to FIGS. 4, 5, and 6.

For example, the instrument 810 (e.g., the instrument 410 of FIG. 4 and the instrument 510 of FIG. 5) may be a plastic injected part formed through plastic injection, and may include at least one of polyamide, polyacetal, polycarbonate, polyethylene terephthalate, or polyphenylene oxide. The instrument 810 may have a cavity.

The first primer layer 820 (e.g., the first primer layer 420 of FIG. 4) may be applied before the film layer 830 is formed so as to form adhesion between the instrument 810 and the film layer 830. The second primer layer 840 (e.g., the second primer layer 440 of FIG. 4) may be formed on the film layer 830, and be formed in an entire or partial area of the film layer 830. The second primer layer 840 may be formed on an overwrap 831 (e.g., the overwrap 531 of FIG. 5) of the film layer 830. The film layer 830 and the overwrap 831 formed as the film layer 830 overlaps will be described in detail below. The coating layer 850 (e.g., the coating layer 450 of FIG. 4) may be formed on the second primer layer 840. The coating layer 850 may be provided to protect the exterior of the instrument 810 and include at least one of a urethane resin, a thermosetting resin, or a UV curable resin.

For example, operation 730 of forming a film layer may include covering and rolling the first primer layer 820 (e.g., the first primer layer 420 of FIG. 4) using one or more long sheet-type films and forming one or more overwraps 831 (e.g., the overwrap 531 o FIG. 5) that are formed as ends of the films overlap. In this example, the film layer 830 (e.g., the film layer 530 of FIG. 5) may have one or more overwraps 831 in the film layer 830 at which the films overlap, and the number of the overwraps 831 may be determined by the number of the films that form the film layer 830 and/or by the shape of the film layer 830.

For example, referring to FIGS. 8C and 8D, the operation of forming a film layer (e.g., operation 730 in FIG. 7) may include forming the film layer 830 using a plurality of cut films (e.g., four films), or forming the film layer 830 by first forming first films 832 in one direction and an opposite direction on a surface of the first primer layer 820 as illustrated in FIG. 8C and then forming second films 833 in a direction vertical to the direction as illustrated in FIG. 8D.

The film layer 830 may be formed using a plurality of films (e.g., the first films 832 and the second films 833). In this case, a plurality of overwraps 831 (e.g., the overwrap 531 of FIG. 5) at which the films overlap may be formed. The films may overlap by a width of each of the overwraps 831. In this case, the width of each of the overwraps 831 may be approximately 1 mm or less. The width of the overlap 831 may be approximately 0.5 mm or less, or desirably be approximately 0.4 mm or less, approximately 0.3 mm or less, or approximately 0.2 mm or less.

The operation of forming a film layer (e.g., operation 730 in FIG. 7) may include applying a film including metal particles (e.g., the first films 832 and the second films 833)

to surround the first primer layer 820 and applying heat thereto. The operation of forming a film layer may be performed by transferring and printing one or more films onto the first primer layer 820 through hot stamping.

Figure 9:
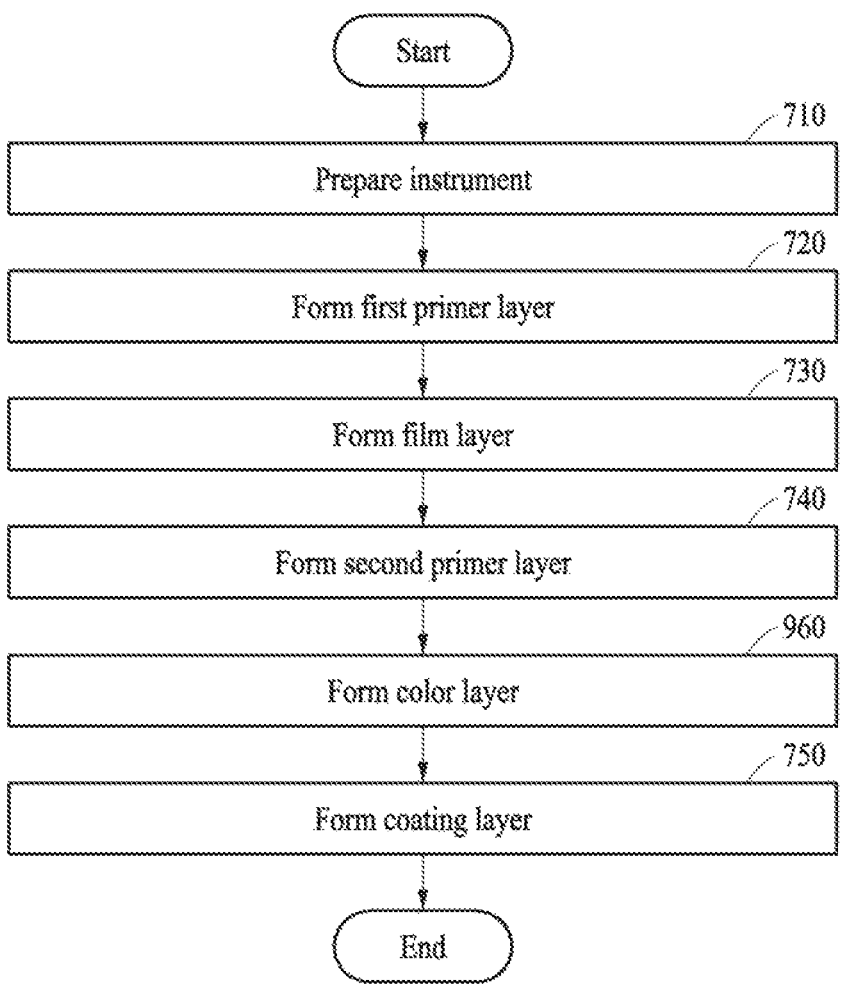
FIG. 9 is a flowchart of a method of manufacturing an electronic device housing according to various example embodiments.
Figures 10A, 10B, 10C, 10D:
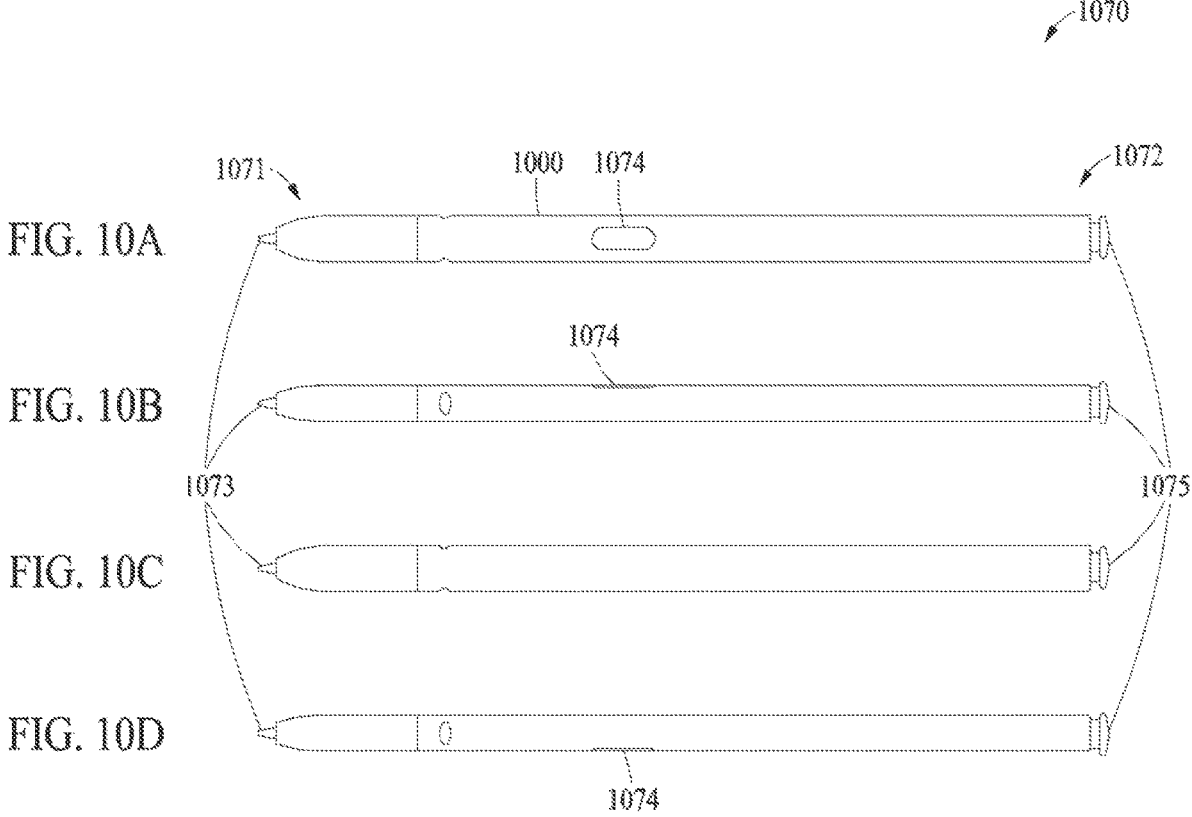
FIGS. 10A, 10B, 10C and 10D are diagrams of an electronic device to which an electronic device housing is applied according to various example embodiments.

FIG. 9 is a flowchart of a method of manufacturing an electronic device housing according to various example embodiments.

Referring to FIG. 9, a method of manufacturing an electronic device housing may include operation 710 of preparing an instrument, operation 720 of forming a first primer layer by applying a first primer on the instrument, operation 730 of forming a film layer on the first primer layer, operation 740 of forming a second primer layer by applying a second primer on the film layer, operation 960 of forming a color layer on the second primer layer, and operation 750 of forming a coating layer on the color layer (i.e., operations 710, 720, 730, 740 and 750 in FIG. 9 may be similar to operations 710, 720, 730, 740 and 750 of FIG. 7).

Before operation 750 of forming a coating layer, operation 960 of forming a color layer on the second primer layer may be additionally performed. The color layer may be the color layer 660 of FIG. 6 which may be formed between the second primer layer 840 and the coating layer 850.

According to an example embodiment, a method of manufacturing an electronic device housing may include an operation (e.g., operation 710 in FIG. 7) of preparing an instrument, an operation (e.g., operation 720 in FIG. 7) of forming a first primer layer by applying a first primer on the instrument, an operation (e.g., operation 730 in FIG. 7) of forming a film layer on the first primer layer, an operation (e.g., operation 740 in FIG. 7) of forming a second primer layer by applying a second primer on the film layer, and an operation (operation 750 in FIG. 7) of forming a coating layer on the second primer layer. The operation (e.g., operation 730) of forming a film layer may include applying a film including metal particles to surround the first primer layer and applying heat thereto.

The film layer may have at least one overwrap at which the film layer overlaps.

A width of the overwrap may be 1 mm or less.

According to an example embodiment, an electronic device surrounded by an electronic device housing may include the electronic device housing that includes an instrument (e.g., the instrument 410 of FIG. 4), a first primer layer (e.g., the first primer layer 420 of FIG. 4) formed to surround the instrument, a film layer (e.g., the film layer 430 of FIG. 4) formed on the first primer layer, a second primer layer (e.g., the second primer layer 440 of FIG. 4) formed on the film layer, and a coating layer (e.g., the coating layer 450 of FIG. 4) formed on the second primer layer. The film layer (e.g., the film layer 430 of FIG. 4) may have at least one overwrap (e.g., the overwrap 431 of FIG. 4) at which the film layer overlaps that is configured to surround the first primer layer.

FIGS. 10A, 10B, 10C and 10D are diagrams of an electronic device to which an electronic device housing is applied according to various example embodiments.

Referring to FIGS. 10A through 10D, an electronic device 1070 may include a first end 1071 and a second end 1072, and an elongated electronic device housing 1000 (e.g., the electronic device housing 400 of FIG. 4). The electronic device 1070 may include a button 1074 disposed on an outer surface thereof, and have a dielectric tip 1073 at the first end 1071. The dielectric tip 1073 may be electrically connected to an electromagnetic resonance (EMR) coil and at least one module for operations of the electronic device 1070. The module may be provided in the form of a PCB which is electrically connected to the EMR coil. The electronic device 1070 may include a push button 1075 at the second end 1072 formed on an opposite side of the first end 1071. The push button 1075 may facilitate insertion into or ejection from another electronic device. For example, the electronic device 1070 may be fastened to another electronic device to be in a fixed state when the push button 1075 is pushed, and may be present separately by being ejected from the other electronic device when the push button 1075 is released.

The electronic device 1070 may generate an input signal of the button 1074 in response to an input from a user, and transmit such a signal in response to the input to the button 1074 to another electronic device through a method determined selectively from between an EMR input method and a Bluetooth low energy (BLE) input method.

Figure 11:
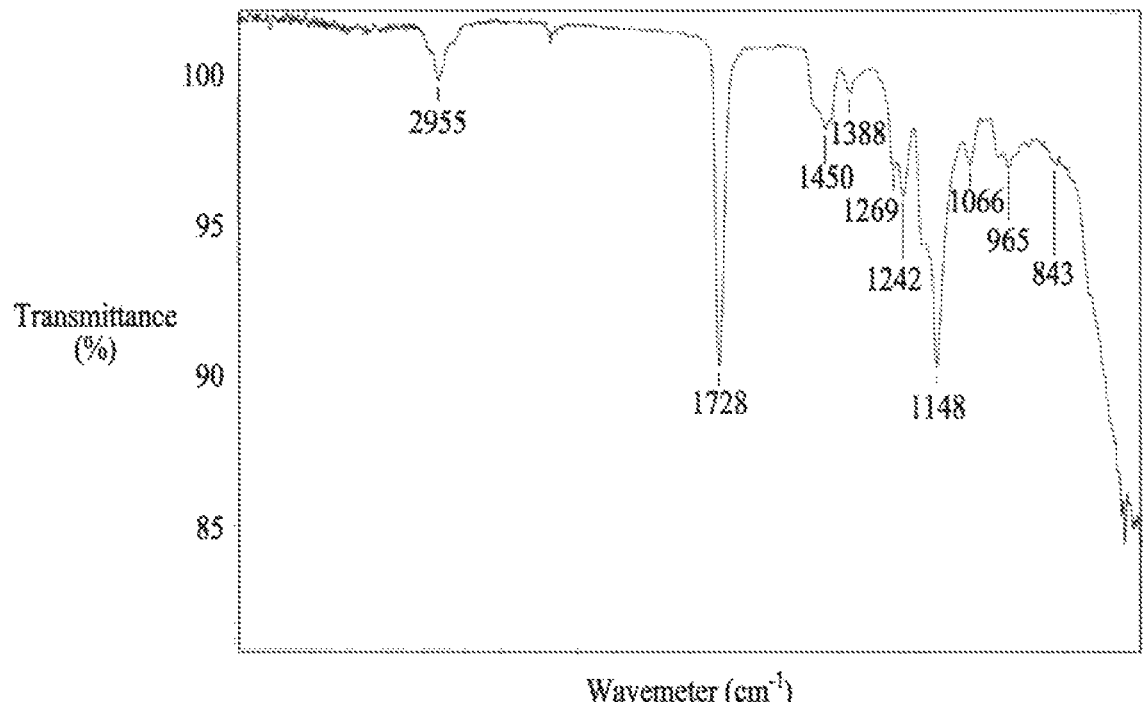
FIG. 11 is a graph of a Fourier transform infrared (FTIR) spectroscopy of a first primer layer according to various example embodiments.

FIG. 11 is a graph of a Fourier transform infrared (FTIR) spectroscopy of a first primer layer according to various example embodiments.

According to an example embodiment, a first primer layer (e.g., the first primer layer 420 of FIG. 4) may include at least one of an acrylic resin, an epoxy resin, or a polyester resin. For example, the first primer layer may include an acrylic resin, and by analyzing the first primer layer using an FTIR method, a graph may be obtained from an FTIR analysis of the acrylic resin as illustrated in FIG. 11.

According to various example embodiments, an electronic device may be a device of one of various types. The electronic device may include, as non-limiting examples, a portable communication device (e.g., a smartphone, etc.), a computing device, a portable multimedia device, a portable medical device, a camera, a wearable device, or a home appliance. However, the electronic device is not limited to the foregoing examples.

It should be appreciated that various example embodiments of the present disclosure and the terms used therein are not intended to limit the technological features set forth herein to particular example embodiments and include various changes, equivalents, or replacements for a corresponding example embodiment. In connection with the description of the drawings, like reference numerals may be used for similar or related components. It is to be understood that a singular form of a noun corresponding to an item may include one or more of the things, unless the relevant context clearly indicates otherwise. As used herein, "A or B," "at least one of A and B," "at least one of A or B," "A, B or C," "at least one of A, B and C," and "A, B, or C," each of which may include any one of the items listed together in the corresponding one of the phrases, or all possible combinations thereof. Terms such as "first," "second," or "first" or "second" may simply be used to distinguish the component from other components in question, and do not limit the components in other aspects (e.g., importance or order). It is to be understood that if an element (e.g., a first element) is referred to, with or without the term "operatively" or "communicatively," as "coupled with," "coupled to," "connected with," or "connected to" another element (e.g., a second element), it means that the element may be coupled with the other element directly (e.g., wiredly), wirelessly, or via a third element.

As used in connection with various example embodiments of the disclosure, the term "module" may include a unit implemented in hardware, software, or firmware, and may interchangeably be used with other terms, for example, "logic," "logic block," "part," or "circuitry." A module may be a single integral component, or a minimum unit or part thereof, adapted to perform one or more functions. For example, according to an example embodiment, the module may be implemented in the form of an application-specific integrated circuit (ASIC).

According to various example embodiments, each component (e.g., a module or a program) of the above-described components may include a single entity or multiple entities, and some of the multiple entities may be separately disposed in different components. According to various example embodiments, one or more of the above-described components or operations may be omitted, or one or more other components or operations may be added. Alternatively or additionally, a plurality of components (e.g., modules or programs) may be integrated into a single component. In such a case, according to various example embodiments, the integrated component may still perform one or more functions of each of the plurality of components in the same or similar manner as they are performed by a corresponding one of the plurality of components before the integration. According to various example embodiments, operations performed by the module, the program, or another component may be carried out sequentially, in parallel, repeatedly, or heuristically, or one or more of the operations may be executed in a different order or omitted, or one or more other operations may be added.

The foregoing description merely shows the optional implementations of some implementation scenarios of the present disclosure. For a person of ordinary skill in the art, without departing from the technical ideal of the solutions of the present disclosure, other similar implementation means based on the technical idea of the present disclosure shall also fall into the protection scope of the embodiments of the present disclosure.

What is claimed is:

1. An electronic device housing, comprising:
an instrument;
a first primer layer provided to cover the instrument;
a film layer provided on the first primer layer;
a second primer layer provided on the film layer; and
a coating layer provided on the second primer layer,
wherein the film layer has at least one overwrap at which the film layer overlaps and is configured to surround the first primer layer.

2. The electronic device housing of claim 1, wherein the instrument comprises a hollow structure, and
wherein the first primer layer is provided on an outer surface of the instrument.

3. The electronic device housing of claim 1, wherein the instrument comprises at least one of polyamide, polyacetal, polycarbonate, polyethylene terephthalate, or polyphenylene oxide.

4. The electronic device housing of claim 1, wherein the first primer layer comprises at least one of an acrylic resin, an epoxy resin, or a polyester resin.

5. The electronic device housing of claim 1, wherein the first primer layer has a thickness of about 1 μm or greater.

6. The electronic device housing of claim 1, wherein the film layer comprises at least one metal among aluminum, magnesium, gold, silver, tin, indium, chromium, and copper.

7. The electronic device housing of claim 1, wherein the film layer has a thickness of about 1 μm to about 5 μm.

8. The electronic device housing of claim 1, wherein the film layer is formed, as films comprising metal particles surround the first primer layer and heat is applied thereto.

9. The electronic device housing of claim 1, wherein a width of the at least one overwrap is less than or equal to about 1 mm.

10. The electronic device housing of claim 1, wherein the film layer comprises a first layer, a second layer, and a third layer, wherein the first layer is provided on the first primer layer, wherein the second layer is provided on the first layer, wherein the third layer is provided on the second layer such that the third layer is disposed between the second layer and the second primer layer, wherein the first layer comprises at least one of an acrylic resin, an epoxy resin, or a polyester resin, wherein the second layer comprises metal particles, wherein the third layer comprises at least one of an acrylic resin, a polyester resin, an acrylate resin, a modified urethane acrylate resin, or an amine acrylic resin, and wherein a sum of thicknesses of the first layer, the second layer, and the third layer is about 1 μm to about 5 μm.

11. The electronic device housing of claim 1, wherein the second primer layer comprises at least one of an acrylic resin, a polyester resin, an acrylate resin, a modified urethane acrylate resin, or an amine acrylic resin.

12. The electronic device housing of claim 1, wherein the second primer layer has a thickness of about 3 μm or greater.

13. The electronic device housing of claim 1, wherein the second primer layer is thicker than the first primer layer.

14. The electronic device housing of claim 1, wherein the second primer layer comprises a first resin and a second resin, wherein the first resin has a glass transition temperature of about 0° C. to about 30°° C., and wherein the second resin has a glass transition temperature of about 80° C. to about 100° C.

15. The electronic device housing of claim 1, wherein the coating layer comprises at least one of a urethane resin, a thermosetting resin, or an ultraviolet (UV) curable resin, and wherein the coating layer has a thickness of about 15 μm to about 40 μm.

16. The electronic device housing of claim 1, further comprising:

a color layer provided between the second primer layer and the coating layer, wherein the color layer comprises at least one of $SiO_2$, $TiO_2$, $Al_2O_3$, $Nb_2O_5$, $MgF_2$, $Ti_2O_5$, $SnO_2$, ZnO, $Ta_2O_5$, MgO, $Si_3N_4$, ITO, lIN, AlON, TIN, $Ti_3O_5$, or $ZrO_2$, and wherein the color layer has a thickness of about 3 μm to about 10 μm.

17. An electronic device surrounded by an electronic device housing, wherein the electronic device housing comprising:

an instrument;

a first primer layer provided to surround the instrument;

a film layer provided on the first primer layer;

a second primer layer provided on the film layer; and a coating layer provided on the second primer layer, wherein the film layer has at least one overwrap at which the film layer overlaps and is configured to surround the first primer layer.

* * * * *